US006381728B1

(12) United States Patent
Kang

(10) Patent No.: US 6,381,728 B1
(45) Date of Patent: *Apr. 30, 2002

(54) PARTITIONED INTERLEAVER MEMORY FOR MAP DECODER

(75) Inventor: Inyup Kang, San Diego, CA (US)

(73) Assignee: Qualcomm Incorporated, San Diego, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/259,665

(22) Filed: Feb. 26, 1999

Related U.S. Application Data

(60) Provisional application No. 60/096,489, filed on Aug. 14, 1998.

(51) Int. Cl.[7] .............................................. H03M 13/00
(52) U.S. Cl. ....................... 714/781; 714/794; 714/796; 714/795; 375/265
(58) Field of Search ................................ 714/781, 795, 714/794, 786–788, 744, 746, 753, 755, 789, 796; 375/200, 130, 262, 259, 265; 370/240, 25, 260, 203, 265, 352, 400, 402, 463

(56) References Cited

U.S. PATENT DOCUMENTS

| | | | | |
|---|---|---|---|---|
| 4,020,290 A | * | 4/1977 | Perna et al. ................. 370/381 |
| 4,059,825 A | * | 11/1977 | Greene ....................... 714/762 |
| 4,539,684 A | * | 9/1985 | Kloker ........................ 714/789 |
| 4,559,568 A | * | 12/1985 | Watanabe et al. ............. 360/48 |
| 4,907,233 A | * | 3/1990 | Deutsch et al. .............. 714/755 |
| 5,014,276 A | * | 5/1991 | Bush et al. .................. 714/704 |
| 5,103,459 A | | 4/1992 | Gilhousen et al. .......... 370/209 |
| 5,208,816 A | * | 5/1993 | Seshardi et al. ............. 714/795 |
| 5,263,051 A | * | 11/1993 | Eyuboglu .................... 375/254 |
| 5,537,444 A | * | 7/1996 | Nill et al. ................... 375/254 |
| 5,588,112 A | * | 12/1996 | Dearth et al. .................. 714/9 |
| 5,659,781 A | * | 8/1997 | Larson ......................... 712/11 |
| 5,825,807 A | * | 10/1998 | Kumar ....................... 375/200 |
| 5,933,462 A | * | 8/1999 | Viterbi et al. ............... 375/341 |
| 5,935,270 A | * | 8/1999 | Lin ............................ 714/795 |
| 6,023,783 A | * | 2/2000 | Divsalar et al. ............ 714/792 |
| 6,141,384 A | * | 10/2000 | Wittig et al. ........... 375/240.25 |

FOREIGN PATENT DOCUMENTS

| | | | |
|---|---|---|---|
| EP | 0856949 | 1/1997 | .......... H03M/13/00 |
| EP | 9724850 | 7/1997 | ........... H04L/27/06 |

OTHER PUBLICATIONS

Hsu et al (A Parallel Decoding Scheme for Turbo Codes. IEEE, Mar. 1998).*

(List continued on next page.)

Primary Examiner—Albert Decady
Assistant Examiner—Guy J. Lamarre
(74) Attorney, Agent, or Firm—Philip R. Wadsworth; Charles D. Brown; Howard H. Seo

(57) ABSTRACT

The present invention is a novel and improved technique for decoding with particular application to turbo, or iterative, coding techniques. In accordance with one embodiment of the invention a system for decoding includes a channel deinterleaver RAM for storing a block of symbol estimates and for reading out at least three different portions of said block in substantially simultaneous fashion. A set of 3 state metric calculators receives the three portion in a substantially simultanous fashion and generate corresponding sets of state metric calculations from said three portions of the channel deinterleaver block.

8 Claims, 7 Drawing Sheets

OTHER PUBLICATIONS

Dawid, et al.(Real–Time Algorithms and VLSI Architectures for Soft Output MAP Convolutional Decoding. IEEE 1995).*

Ambose et al.(Iterative Map Decoding for Serial Concatenated Convolutionanl Codes. IEEE, Apr. 1998).*

Viterbi, A.J.: "An Intuitive Justification and a Simplified Implementation of the Map Decoder for Convolutional Codes", IEEE Journal on Selected Areas in Communications, US, IEEE Inc. New York, vol.16, No. 2, pp. 260–264.

Hsu, J.M: "A Parallel Decoding Scheme for Turbo Codes", International Symposium on Systems and Circuits ISCAS '98, May 31, 1998–Jun.3, 1998, pp.445–448.

Halter, S. et al.: "Reconfigurable Signal Processor for Channel Coding and Decoding in Low SNR Wireless Communications", IEEE Workshop on Signal Processing Systems 1998, Oct. 8–10, 1998, pp. 260–274.

TR45.5.4 Standards Document Entitled "Turbo Code and Its Performance", by Lee et al., Hughes Network Systems, Phoenix AZ, (6 pages), 1997.

"Implementation and Performance of a Turbo/MAP Decoder", by Steven S. Pietroban, Sr. Member, IEEEE; (45 pages).

* cited by examiner

PARTITIONED INTERLEAVER MEMORY FOR MAP DECODER

CROSS-REFERENCE TO RELATED APPLICATION

This application claims priority under the benefit of U.S.C Section 120 to Provisional Patent Application No. 60/096,489, filed Aug. 14, 1998, and entitled "Turbo Decoder Architecture", and said Provisional Application is incorporated herein by reference.

BACKGROUND OF THE INVENTION

I. Field of the Invention

The present invention relates to channel coding. More particularly, the present invention relates to a novel and improved technique for performing maximum a posteriori (MAP) decoding.

II. Description of the Related Art

"Turbo coding" represents an important advancement in the area of forward error correction (FEC). There are many variants of turbo coding, but most use multiple encoding steps separated by interleaving steps combined with iterative decoding. This combination provides previously unavailable performance with respect to noise tolerance in a communications system. That is, turbo coding allows communications at $E_b/N_0$ levels that were previously unacceptably using the forward error correction techniques available at that time.

Many systems use forward error correction, and therefore would benefit from the use of turbo coding. For example, turbo codes could improve the performance of wireless satellite links, where the limited downlink transmit power of the satellite necessitates receiver systems that can operate at low $E_b/N_0$ levels. Using turbo codes in a wireless satellite link could reduce the dish size for a digital video broadcast (DVB) system, or, alternatively, allow more data to be transmitted within a given frequency bandwidth.

Digital wireless telecommunication systems, such as digital cellular and PCS telephone systems, also use forward error correction. For example, the IS-95 over-the-air interface standard, and its derivatives, such as IS-95B, define a digital wireless communications system that uses convolutional encoding to provide coding gain to increase the capacity of the system. A system and method for processing RF signals substantially in accordance with the use of the IS-95 standard is described in U.S. Pat. No. 5,103,459 entitled "System and Method for Generating Signal Waveforms in a CDMA Cellular Telephone System" assigned to the assignee of the present invention and incorporated herein by reference ('459 patent).

Because digital wireless communication system like IS-95 are primarily for mobile communications, it is important to have devices that minimize power usage and which are small and light weight. Typically, this requires development of a semiconductor integrated circuit ("chip") for performing most, or all, of the necessary processing. While convolutional encoding is relatively complex, the circuits necessary to perform convolutional encoding and decoding can be formed on a single chip along with any other necessary circuitry.

Turbo coding (in particular the decoding operation) is significantly more complex than convolutional encoding (and decoding). Nonetheless, it would be highly desirable to include turbo coding in digital wireless telecommunication systems, including mobile digital communication systems and satellite communication system. Thus, the present invention is directed to increasing the rate at which certain decoding operations can be performed, to facilitate the use of turbo coding in a variety of systems.

SUMMARY OF THE INVENTION

The present invention is a novel and improved technique for decoding technique with particular application to turbo, or iterative, coding techniques. In accordance with one embodiment of the invention a system for decoding includes a channel deinterleaver RAM for storing a block of symbol estimates and for reading out at least three different portions of said block in substantially simultaneous fashion. A set of 3 state metric calculators receives the three portion in a substantially simultanous fashion and generate corresponding sets of state metric calculations from said three portions of the channel deinterleaver block.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

The present invention is a novel and improved technique for performing turbo coding. The exemplary embodiment is described in the context of the digital cellular telephone system. While use within this context is advantageous, different embodiments of the invention may be incorporated in different environments, configurations or digital data transmission systems, including satellite communication systems and wire line communication system such as digital cable and telephone systems.

In general, the various systems described herein may be formed using software controlled processors, integrated circuits, or discreet logic, however, implementation in an integrated circuit is preferred. The data, instructions, commands, information, signals, symbols and chips that may be referenced throughout the application are advantageously represented by voltages, currents, electromagnetic waves, magnetic fields or particles, optical fields or particles, or a combination thereof. In addition, the blocks shown in each block diagram may represent either hardware or method steps.

Figure 1A:
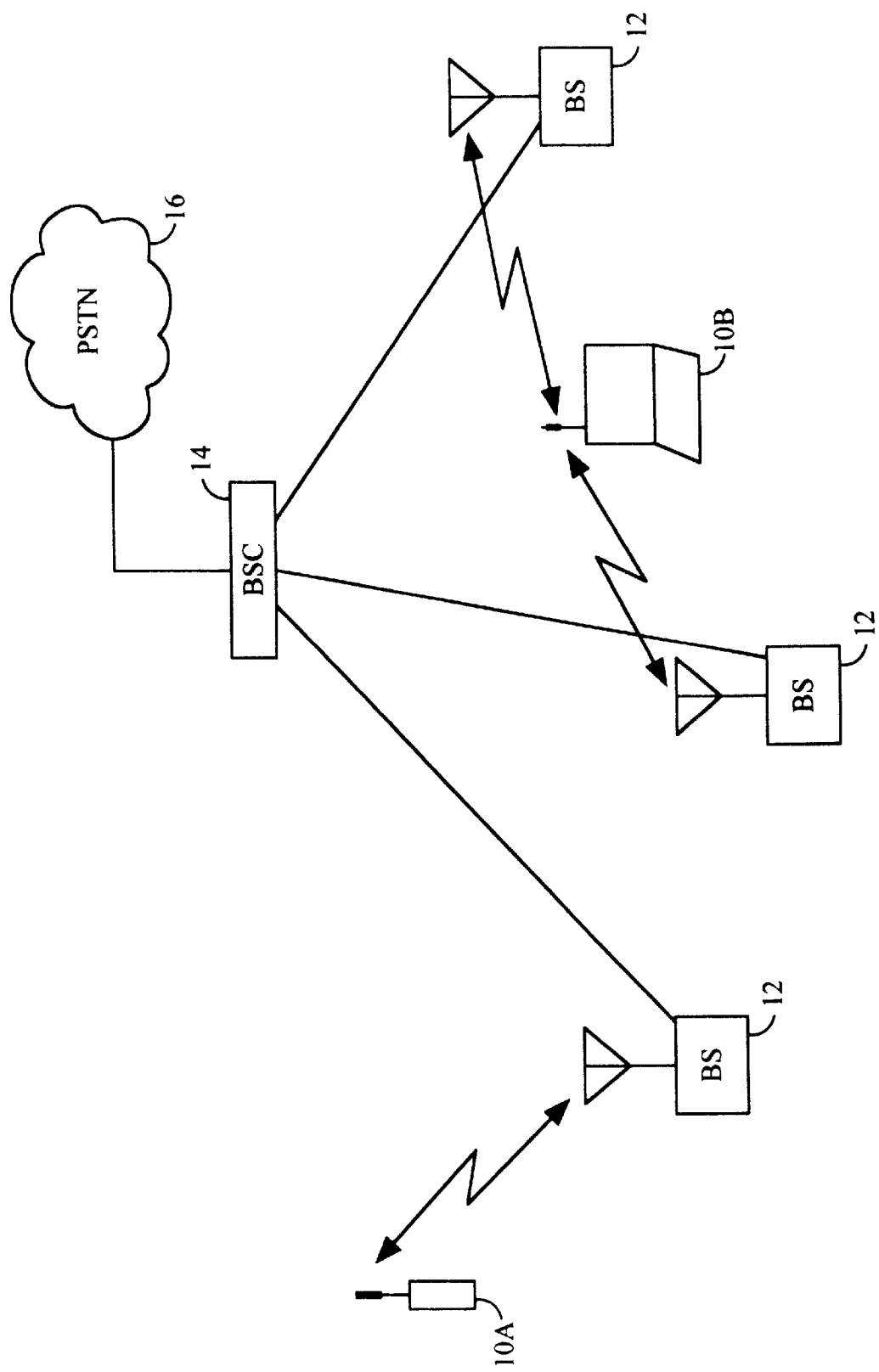
FIGS. 1A and 1B are block diagrams of wireless communication systems.

FIG. 1A is a highly simplified diagram of a cellular telephone system configured in accordance with one embodiment of the invention. To conduct telephone calls or other communications, subscriber units 10 interface with base stations 12 via RF signals. Base stations 12 interface with the public switch telephone network via base station controller (BSC) 14.

Figure 1B:
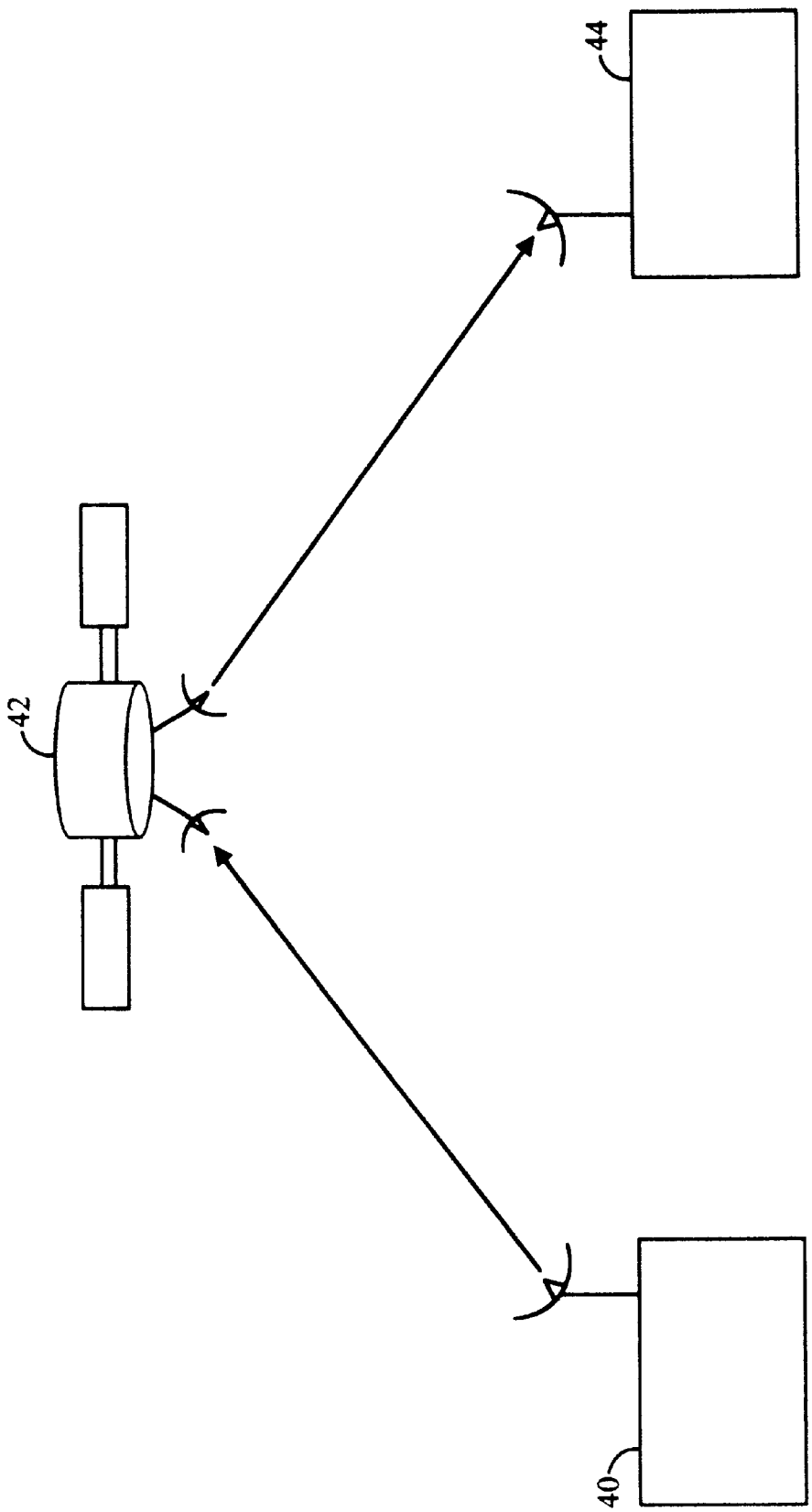

FIG. 1B is a highly simplified diagram of a satellite communications system configured in accordance with another embodiment of the invention. Uplink station 40 transmits RF signals containing information such as video programming to satellite 42. Satellite 42 relays the RF signals back to earth where receiver 44 converts the receive RF signals into digital data.

Figure 2:
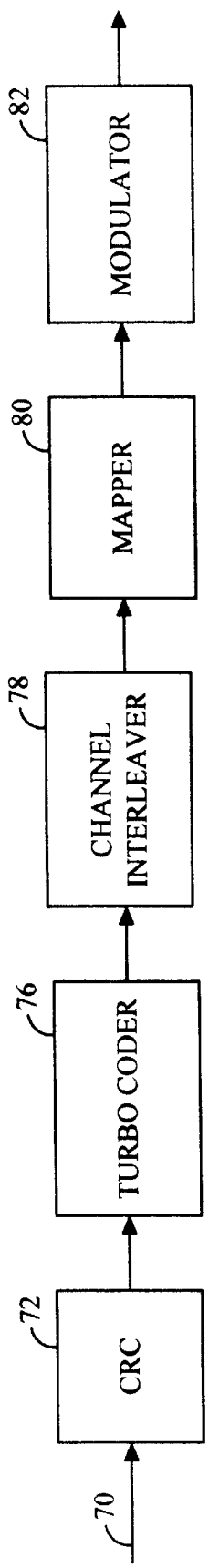
FIG. 2 is a block diagram of a transmit system.

FIG. 2 is a block diagram of an exemplary transmit system configured in accordance with the use of one embodiment present invention. The transmit system can be used within a subscriber unit 10, a base stations 12, or uplink station 40, as well as any other system that generates digital signals for transmission. The transmit processing shown represent just one possible embodiment of the invention, as numerous other transmit processing schemes may incorporate and benefit from the use of various embodiments of the invention.

Data 70 is supplied to CRC generator 72 which generates CRC checksum data for a given each predetermined amount of data received. The resulting data blocks are supplied to turbo coder 76 which generates code symbols that are supplied to channel interleaver 78. The code symbols typically include a retransmission of the original data (the systematic symbol), and one or more parity symbols.

The number of parity symbols transmitted for each systematic symbol depends on the coding rate. For a coding rate of ½ one parity symbol is transmitted for every systematic symbol, for a total of two symbols generated for each data bit (including CRC) received. For a rate ⅓ turbo coder, two parity symbols are generated for each systemic symbol, for a total of three symbols generated for each data bit received.

The code symbols from the turbo coder 76 are supplied to channel interleaver 78. Channel interleaver 78 performs interleaving on blocks the symbols as they are received, outputting interleaved symbols that are received by mapper 80. Typically, channel interleaver 78 performs block or bit-reversal interleaving, virtually all other types of interleavers many be used as the channel interleaver.

Mapper 80 takes the interleaved code symbols and generates symbol words of certain bit width based on a predetermined mapping scheme. The symbol words are then applied to modulator 82 which generates a modulated wave form based on the symbol word received. Typical modulation techniques include QPSK, 8-PSK, and 16 QAM, although various other modulation schemes may be utilized. The modulated waveform is then upconverted for transmission at an RF frequency.

Figure 3A:
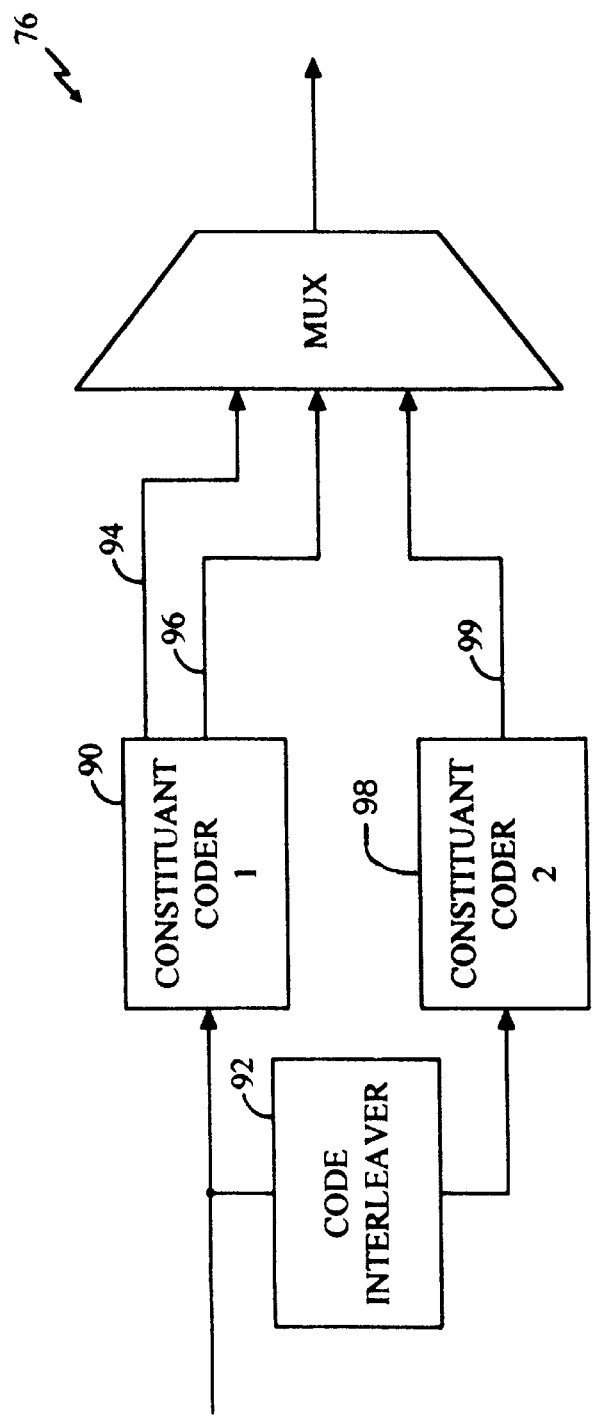
FIGS. 3A and 3B are diagrams of turbo coders.

FIG. 3A is a block diagram of a turbo coder configured in accordance with a first embodiment of the invention. In this first embodiment of the invention, the turbo coder is configured as a parallel concatenated turbo coder. Within the version of the turbo coder 76, constituent coder 90 and code interleaver 92 receive the data from CRC generator 72, which as described above output the input data and CRC checksum bits.

As is well known, code interleaver 92 should be a highly randomized interleaver for the best performance. An interleaver that provides excellent performance with minimal complexity as a code interleaver is described in copending U.S. patent application Ser. No. 09/158,459, filed Sep. 22, 1998 entitled "Coding system having state machine based interleaver" assigned to the assignee of the present application now U.S. Pat. No. 6,046,171 and incorporated herein by reference. Constituent coder 90 outputs systematic symbols 94 (typically a copy of the original input bits) and parity symbols 96. Constituent coder 98 receives the interleaved output of code interleaver 92 and outputs additional parity symbols 99. Tail bits may also be added, but are omitted because they are not particularly relevant to the present invention.

The outputs of constituent coder 90 and constituent coder 98 are muxed into the output data stream for a total coding rate R of ⅓. Additional constituent codes and code interleaver pairs may be added to reduce the coding rate for increased forward error correction. Alternatively, some of the parity symbols 96 and 99 may be punctured (not transmitted) to increase the coding rate. For example, the coding rate could be increased to ½ by puncturing every other parity symbol 96 and 99, or not transmitting parity symbol 96 at all.

Constituent coders 90 and 98 may be various types of coders including block coders or convolutional coders. As convolutional coders, constituent coders 90 and 98 typically have a small constraint length such as 4 (four) to reduce complexity, and are recursive systematic convolutional (RSC) encoders. The lower constraint length reduces the complexity of the corresponding decoder at the receive system.

Typically, the two coders output one systematic symbol and one parity symbol for each bit received for a constituent coding rate R=½. The total coding rate for the turbo coder of FIG. 1A is R=⅓, however, because the systematic bit from constituent coder 98 is not used. As noted above, additional interleaver and coder pairs may also be added in parallel to reduce the coding rate, and therefore provide higher error correction, or puncturing can be performed to increase the coding rate.

Figure 3B:
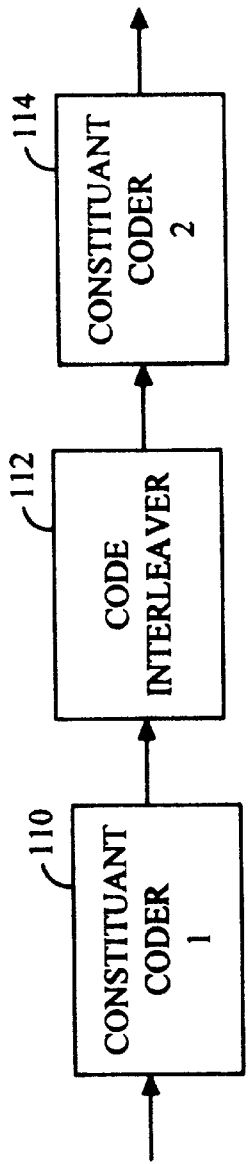

FIG. 3B depicts turbo coder 76 as a serial concatenated turbo coder in accordance with an alternative embodiment of the invention. Within the turbo coder of FIG. 3B, the data from CRC generator 72 is received by constituent coder 110 and the resulting code symbols are applied to code interleaver 112. The resulting interleaved parity symbols are supplied to constituent coder 114, which performs additional encoding to generate parity symbols 115. Typically, constituent coder 110 (the outer coder) may be various types of encoders including block encoders or convolutional encoders, but constituent coder 114 (the inner coder) is preferably a recursive coder and is typically a recursive systematic encoder.

As recursive systematic convolutional (RSC) encoders, constituent coders 110 and 114 generate symbols at a coding rate R<1. That is, for a given number of input bits N, M output symbols are generated where M>N. The total coding rate for the serial concatenated turbo coder of FIG. 1B is the coding rate of constituent coder 110 multiplied by the coding rate of constituent coder 114. Additional interleaver and coder pairs may also be added in series to reduce the coding rate and therefore provide additional error protection.

Figure 4:
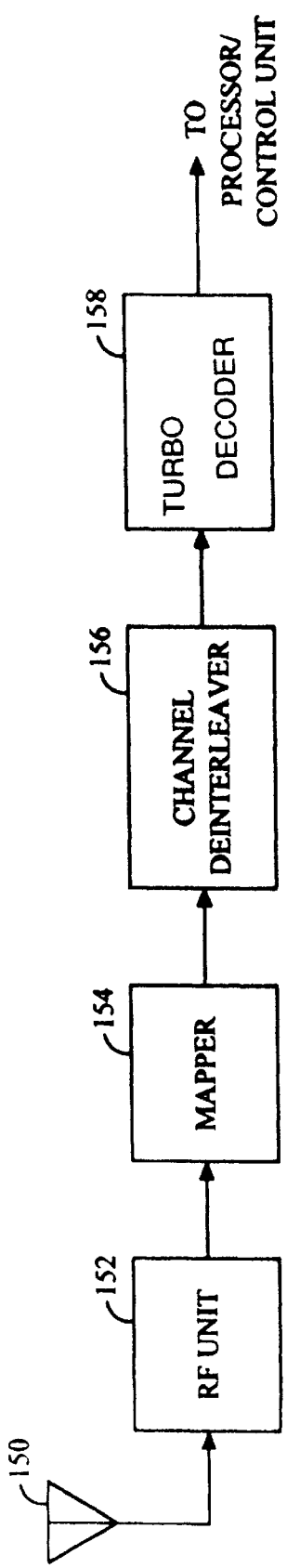
FIG. 4 is a block diagram a receive processing system.

FIG. 4 is a block diagram of a receive system configured in accordance with one embodiment of the invention. Antenna 150 provides the received RF signals to RF unit 152. RF unit performs downconvertion, filtering, and digitization of the RF signals. Mapper 154 receives the digitized data and provides soft decision data to channel deinterleaver 156. Turbo decoder 158 decodes the soft decision data from channel deinterleaver 156 and supplies the resulting hard decision data to the processor or control unit at the receive system, which can check the accuracy of the data using the CRC checksum data.

Figure 5:
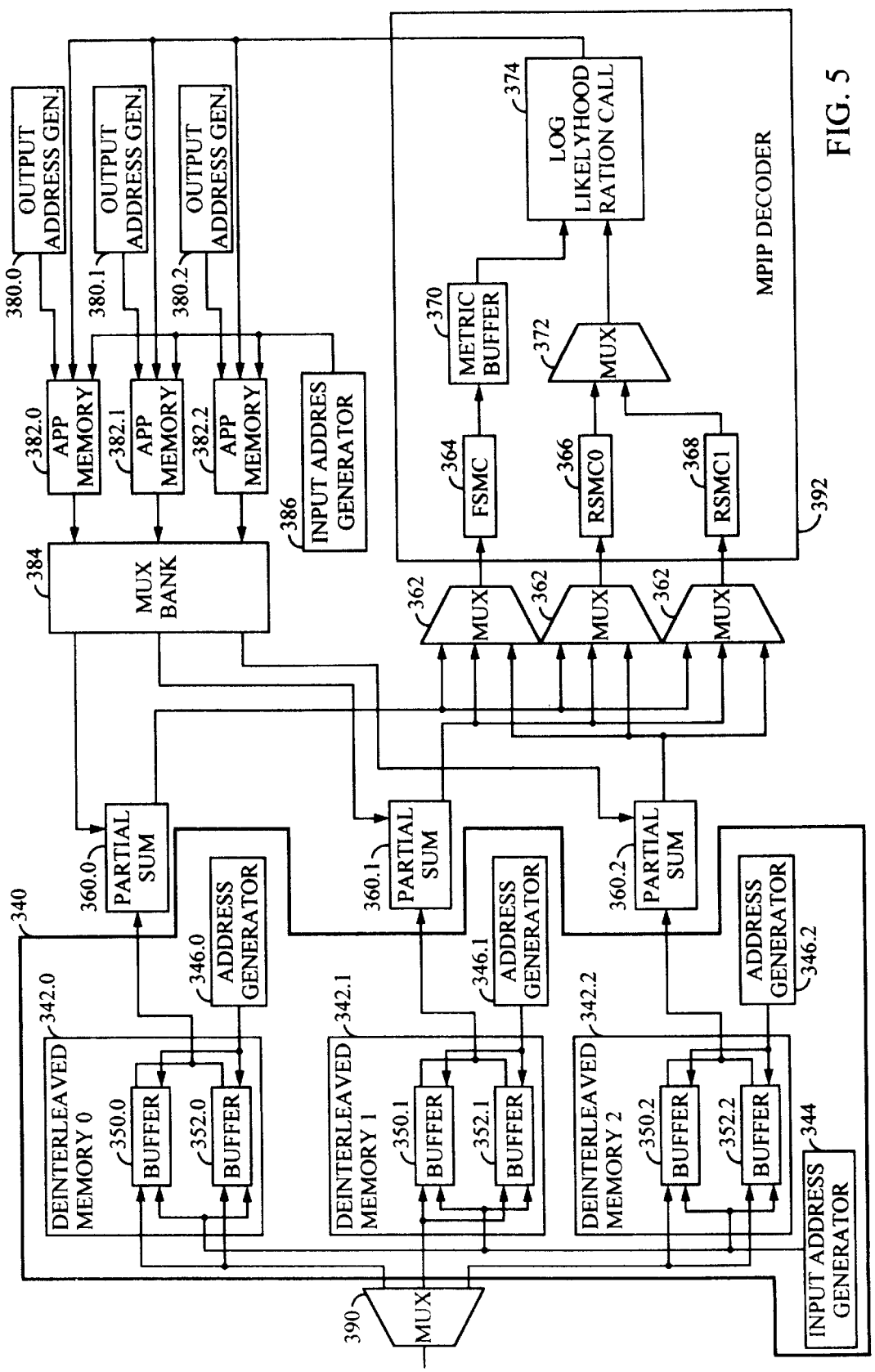
FIG. 5 is a block diagram of decoder and a portion of a channel deinterleaver.

FIG. 5 is a block diagram of turbo decoder 158 and a portion of the channel deinterleaver when configured in accordance with one embodiment of the invention. As shown, turbo decoder 158 is configured for decoding the data from the turbo coder shown in FIG. 3A.

In the described embodiment, channel deinterleaver portion 340 includes deinterleaver memory banks 342.0–342.2. Together deinterleaver memory banks 342.0–342.2 form the entire deinterleaver memory. Deinterleaver memory banks 340 are double buffered in one embodiment of the invention, and include a first buffer 350 and a second buffer 352. During normal operation, one buffer is available for writing into while the other buffer is available for reading out. Also, double buffering allows the channel interleaver memory to be used, along with the app memory, as the turbo deinterleaver memory.

Symbol estimates to be deinterleaved are received and written into (one buffer) of each deinterleaver memory 342 via multiplexer 390. When data is being written in, input address generator 344 controls the buffer receiving the symbol estimates.

In a preferred embodiment of the invention, symbol estimates are written into only one deinterleaver memory 342 at any particular time. Each deinterleaver memory 342 receives a portion of the total number of symbol estimates in the interleaver block. That is, deinterleaver memory 342.0 receives a first portion of the symbol estimates in the channel interleaver block, deinterleaver memory 342.1 receives a second portion of the symbol estimates in the channel interleaver block, and deinterleaver memory 342.2 receives a third portion of the symbol estimates in the channel interleaver block.

In one embodiment of the invention, one deinterleaver memory 342 receives the first of every third (1st of 3) "window" of symbol estimates in the channel interleaver block. A window is just a predetermined number (L) of symbol estimates related to the decoding process as described below. Another deinterleaver memory 342 receives the second of every third (2nd of 3) window of symbol estimates and the third deinterleaver memory receives the third of every third (3rd of 3) window of symbol estimates. As should be apparent, the window L of symbol estimates is smaller than the size of the interleaver block. Multiplexer 390 directs the symbol estimates to the particular deinterleaver memory 342.

In an exemplary processing, a first window (1L) of symbol estimates is first written into deinterleaver memory 342.0. The second window (2L) of symbol estimates is written into deinterleaver memory 342.1, and the third window (3L) of symbol estimates is written into deinterleaver memory 342.2. This pattern is repeated for all subsequent windows of symbol estimates, so that the every 3NL (where N is an integer) window of symbol estimates is written into deinterleaver memory 342.0, and every 3NL+1 window of symbol estimates are written into deinterleaver memory 342.1 and every 3NL+2 window of symbol estimates is written into deinterleaver memory 342.2. Table I provides a list of the symbol estimates (number from 0 to N) stored in each deinterleaver memory 342.

TABLE I

| Memory 0 | Memory 1 | Memory 2 |
|---|---|---|
| 0 – L-1 | L – 2L-1 | 2L – 3L-1 |
| 3L – 4L-1 | 4L – 5L-1 | 5L – 6L-1 |
| . . . | . . . | . . . |
| 3NL – (3N + 1)L-1 | 3(N + 1)L – 3(N + 2)L-1 | 3(N + 2)L – 3NL-1 |

While symbol estimates for the current interleaver block are written into deinterlever memories 342, the previously received block of estimates are read out from deinterleaver memory 342 to partial sum circuits 360.0–360.2 using the double buffering scheme as described above. In contrast to the writing process, during reading the three deinterleaver memories are preferably read out in substantially simultaneous fashion under the control of address generators 346.0–346.2.

Partial sum circuits 360.0–360.2 receive the symbol estimates (also know as soft decision data) from each deinterleaver memory as well as a priori (APP) data from APP memories 382 via multiplexer bank 384. As is well known in the art of turbo, and turbo-like, coding the APP values are the estimates of the data transmitted based on the previous decoding iteration. During the first decoding iteration, the APP values are set to an unknown intermediate state. More discussion on the APP values is provided below.

The symbol estimates from the channel deinterleaver memories include estimates of the systematic symbol as well as estimates of two parity symbols for each data bit associated with the channel interleaver block. Partial sum circuits 360.0–360.2 add the APP value to the systematic symbol, to create "refined systematic estimates."

The refined systematic estimates, along with parity symbol estimates, from each partial sum circuit 360 are applied to multiplexers 362. For some code rates, punctured symbols are replaced with intermediate values. Multiplexers 362 apply windows of symbol estimates from each deinterleaver memory 342 to each state metric calculator (e.g. forward state metric calculator (FSMC) 364, and reverse state metric calculators 366 and 368.) That is, the symbol estimates from each deinterleaver memory are read three times and, by way of partial sum circuits 360, applied sequentially to one of FSMC 364, RSMC 366, or RSMC 367 so that each set of estimates is applied to each metric calculator once. In this way, a set of forward state metrics and reverse state metrics are generated for each window. The forward state metrics and reverse state metrics are used to generate soft decision estimates of the transmitted pre-encoded information.

Table II provides a more detailed exemplary processing of the symbol estimates. In particular, the deinterleaver memory 342 applied to each state metric calculator (SMC) during each read cycle (by multiplexers 362) are listed, along with the set of L samples contained in that deinterleaver memory.

It should also be noted that Table II illustrates the coupling performed for six (6) windows of data. Thus, the exemplary channel interleaver block size is 6L, and the channel deinterleaver memory is 6Lxq. The channel interleaver block size of 6L is for example only, and the typical channel block size will be larger than 6L.

Still referring to FIG. 5, during the first read cycle, and within MAP decoder 392, FSMC 364 receives the estimates from deinterleaver memory 342.0 (by way of partial sum circuit 360.0 and multiplexer 362). FSMC 364 calculates forward state metric values over a window L. The forward

TABLE II

| Cycle SMC | -1 | 2 | 3 | 4 | 5 | 6 | 7 |
|---|---|---|---|---|---|---|---|
| FSMC | DEINT MEM 0; 0->L-1 | DEINT MEM 1; L->2L-1 | DEINT MEM 2; 2L->3L-1 | DEINT MEM 0; 3L->4L-1 | DEINT MEM 1; 4L->5L-1 | DEINT MEM 2; 5L->6L-1 | |
| RSMC 0 | DEINT MEM 1; 2L-1->L | DEINT MEM 0 L-1->0 | DEINT MEM 0 4L-1->3L | DEINT MEM 2; 3L-1->2L | DEINT MEM 2; 6L-1->5L | DEINT MEM 1; 5L-1->4L | |
| RSMC 1 | | DEINT MEM 2; 3L-1->2L | DEINT MEM 1 2L-1->L | DEINT MEM 1 5L-1->4L | DEINT MEM 0 4L-1->3L | | DEINT MEM 2 6L-1->5L |
| LLR | | L-1->0 | 2L-1->L | 3L-1->2L | 4L-1->3L | 5L-1->4L | 6L-1->5L |

As illustrated by Table II, In the described embodiment of the invention, a sliding window architecture is employed for performing soft-input-soft-output (SISO) log-Maximum A Posteriori (log-MAP) decoding. A system and method for performing this sliding window MAP decoding is described in copending U.S. patent application Ser. No. 08/743,688 now U.S. Pat. No. 5,933,462 entitled "Soft Decision Output Decoder for Decoding Convolutionally Encoded Codewords" assigned to the assignee of the present invention and incorporated herein by reference.

In that patent application, the MAP decoding is performed on the windows of symbol estimates as mentioned above. In the described embodiment of the invention, the windows are L bits in size, where L is the number of transmitted data bits in the window. A refined systematic symbol estimate and two parity symbols estimates are generated for each data bit to be decoded. In one embodiment of the invention, six (6) bits are used for the two parity symbol estimates and seven (7) bits are used for the refined systematic symbol estimates (which as described above is the summation of the receive systematic symbol estimate and the APP value).

A window is processed once in the forward direction and once in the reverse direction in accordance with the MAP processing described in the above referenced patent. Additionally, most windows are processed an additional time in the reverse direction to generate an initialization state for the other reverse state metric processing. In Table II, the initialization passes are denoted by the italicized text.

In the described embodiment, each set of estimates is processed three times, and therefore the deinterleaver memory 342 in which the estimates are stored is accessed three times. Separating the entire interleaver block of symbol estimates into three different deinterleaver memories 342, particularly as described above, allows highly parallel sliding window MAP decoding to be performed without RAM contention.

state metric values are stored in metric buffer 370. Additionally, as shown in Table I, RSMC 366 calculates reverse state metric values during the first processing cycle on another window L of symbol estimates. It should be noted that in one embodiment of the invention, each state metric calculator contains its own branch metric calculator. In other embodiments of the invention, a single time shared branch metric calculator may be used by the set of state metrics.

MAP decoder is preferably a log-MAP decoder, which operates on the logarithm of the estimates rather to reduce the number of multiply operations. One implementation of a log-MAP decoder including state metric and branch metric calculators is described in the reference S.S. Pietrobon, "Implementation and Performance of a Turbo/MAP Decoder," submitted to the *International Journal of Satellite Communications*, January–February, 1998, vol. 1, pp23–4b.

During the next processing cycle, RSMC 368 calculates reverse state metric values as RSMC 366 did in the previous processing cycle (training state metrics).RSMC 366 performs a reverse state metric calculation on the window L for which forward state metrics have already been calculated and stored in metric buffer 370 during the first processing cycle. As the reverse state metrics are calculated, they are forwarded, via multiplexer 372, to the log likelihood ratio (LLR) calculator 374. LLR calculator 374 performs a log likelihood calculation of the reverse state metrics received from mux 372 and the forward state metrics stored in metric buffer 370. The resulting data estimates from LLR 374 are forwarded to APP memories 382.0–382.2.

By using a sliding metric calculation process, the amount of memory used to perform the necessary processing is reduced. In particular, only one window L of forward state metrics need to be stored within metric buffer 276 at any given time. This is in contrast to storing metrics for the entire channel interleaver block which would require prohibitively large amounts of memory.

Additionally, the use of three metric calculators significantly increases the rate at which decoding can be performed. The rate is increased, because the initialization and decoding functions can be performed in parallel.

The data estimates from LLR 374 are written into APP memories 382 under the control of input address generator 386. Each APP memory 382 receives a portion of all the data estimates generated for the interleaver block being processed.

Once the data estimates are written in, another iteration is performed where the original symbol estimates are processed again using the data estimates (also known as APP values) generated during the previous decoding. The APP values are read out of APP memories 382 in substantially simultaneous fashion under the control of output address generators 380.0–380.2. Mux bank 384 couples APP memories 382 to partial sum circuits 360 such that the corresponding symbol estimate and data estimate are partially summed. Once a sufficient number of decoding iterations are performed, the resulting data estimates are used to generate hard decisions.

Figure 6:
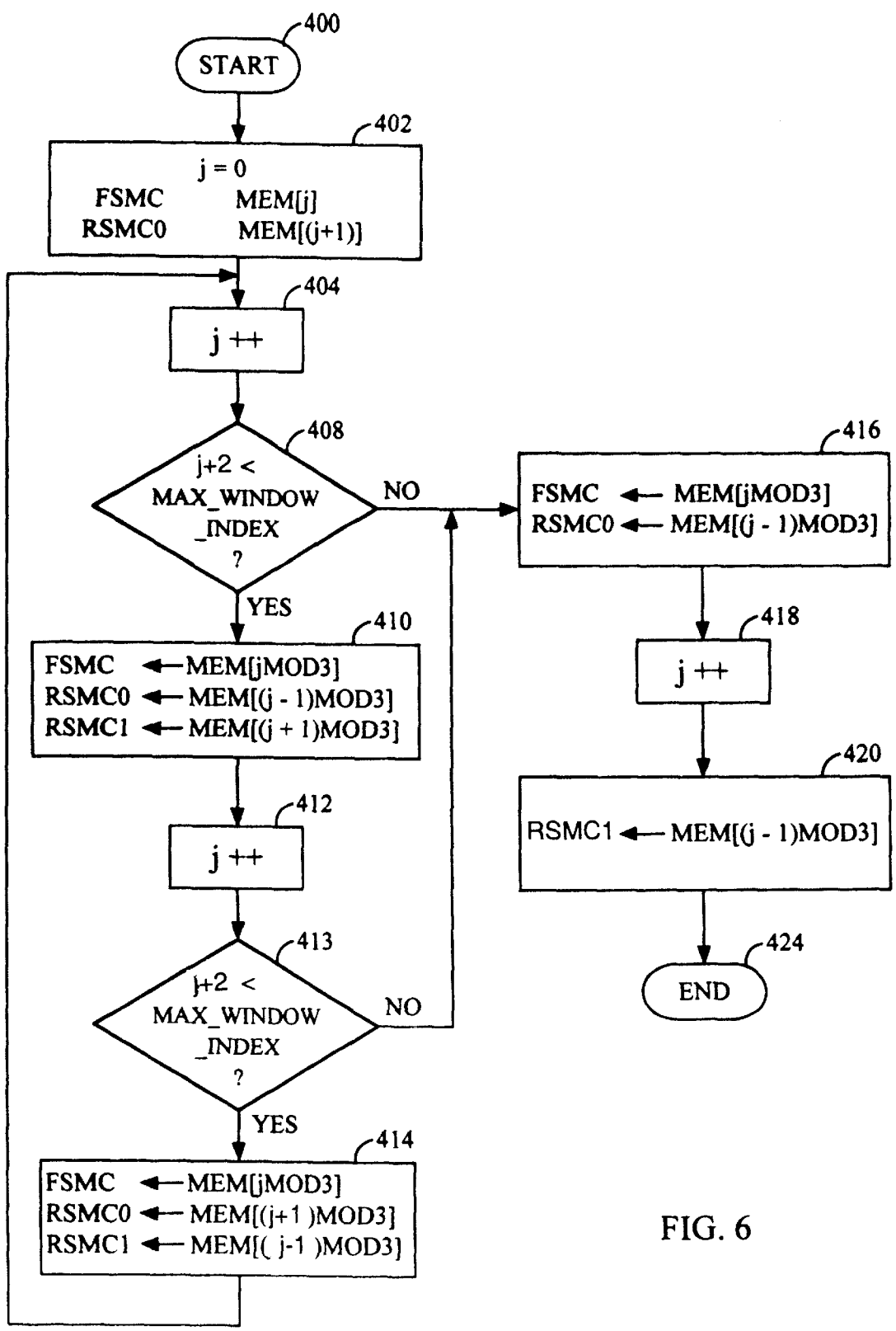
FIG. 6 is a flow chart illustrating an exemplary set of decoding steps.

FIG. 6 is a flow chart illustrating the steps performed during a decoding iteration in accordance with one embodiment of the invention. In this flow chart, deinterleaver memories 342.0–342.2 are referred to as MEM[0]–MEM[2] respectively. Additionally, RSMC 366 is referred to as RSMC 0, and RSMC 368 is referred to as RSMC 1. An index value j is used to designate the particular deinterleaver memory (MEM) accessed at each step, but the use a value j is not necessary to practice the invention.

The decoding begins at step 400 and at step 402 the index value j is set to zero (0). Also at step 402, the forward state metric calculator 364 (FSMC) processes symbol estimates from MEM[0] and RSMC 0 processes symbol estimates from MEM[1].

At step 404 index j is incremented, and at step 408 it is determined if (j+2) is less than the (of symbols estimates (MAX_WINDOW_INDEX) in the interleaver block. If so, FSMC processes symbol estimates from MEM[j mod 3], RSMC 0 processes symbol estimates from MEM[(j−1) mod 3], and RSMC 1 processes symbol estimates from MEM [(j+1) mod 3] at step 410. Once step 410 is performed, j is incremented at step 412 and at step 413 it is determined if (j+2) is less than MAX_WINDOW_INDEX and step 414 is performed.

At step 414, FSMC processes symbol estimates from MEM[j mod 3], RSMC 0 processes symbol estimates from MEM[(j+1) mod 3], and RSMC 1 processes symbol estimates from MEM[(j−1) mod 3]. Once step 414 is performed processing returns to step 404.

If it is determined at step 408 or step 413 that j+2 is not less than MAX_WINDOW_INDEX step 416 is performed. At step 416 FSMC processes symbol estimates from MEM[j mod 3], RSMC 0 processes symbol estimates from MEM [(j−1) mod 3]. At step 418 j is incremented. At step 420 RSMC 1 processes symbol estimates from MEM[(j−1) mod 3]. The processing for the iteration is then terminated at step 424.

Thus, a novel and improved technique for performing turbo coding has been described. The previous description is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A system for decoding comprising:
    a) channel deinterleaver RAM for storing a block of symbol estimates and for reading out at least three different portions of said block before any of the below-recited state metric calculations have been generated;
    b) set of 3 state metric calculators, each state metric calculator for generating a set of state metric calculations;
    c) multiplexer bank for coupling said set of 3 state metric calculators to said at least three different portions of said block.

2. The system as set forth in claim 1 wherein said channel deinterleaver RAM is comprised of:
    a) first deinterleaver RAM for storing a first portion of said block of symbol estimates and for reading out said first portion of said block of symbol estimates;
    b) second deinterleaver RAM for storing a second portion of said block of symbol estimates and for reading out said second portion of said block of symbol estimates;
    c) third deinterleaver RAM for storing a third portion of said block of symbol estimates and for reading out said third portion of said block of symbol estimates.

3. The system as set forth in claim 2 wherein:
    a) said state metric calculators process windows of said symbol estimates, and
    b) said first portion includes every first window of three windows of said block;
    c) said second portion includes every second window of three windows of said block;
    d) said third portion includes every third window of three windows of said block.

4. The system as set forth in claim 1 wherein said channel deinterleaver RAM is comprised of:
    a) first deinterleaver ram for storing a first portion of said block of symbol estimates and for reading out said first portion of said block of symbol estimates;
    b) second deinterleaver ram for storing a second portion of said block of symbol estimates and for reading out said second portion of said block of symbol estimates;
    c) third deinterleaver ram for storing a third portion of said block of symbol estimates and for reading out said third portion of said block of symbol estimates.

5. A system for performing turbo decoding comprising:
    a) channel deinterleaver RAM for storing a block of symbol estimates and for reading out at least three portions of said block, hereafter referred to as a first portion, a second portion, and a third portion, before any of the below-recited state metric calculations have been generated;
    b) set of 3 state metric calculators, each state metric calculator for generating a set of state metric calculations;

c) multiplexer bank for coupling said set of 3 state metric calculators to said at least three different portions of said block;

d) APP memory for storing a priori values and for reading out at least three different portions of said a priori values.

6. The system as set forth in claim 5 wherein:

a) said state metric calculators process windows of said symbol estimates, and b) said first portion includes every first window of three windows of said block;

c) said second portion includes every second window of three windows of said block;

d) said third portion includes every third of three windows of said block.

7. A method for performing turbo decoding comprising:

a) reading out at least three different portions of a channel estimate block at least three different times, with all of the portions being read out before any of the below-recited state metric calculations have been generated for that time;

b) each time, generating state metrics for each different portion during each different read out;

c) storing a first set of said state metrics;

d) calculating symbol estimates using a first set of estimates and a second set of state metrics, where said second set of state metrics is calculated using an initialization value calculated using a third set state metrics.

8. The method as set forth in claim 7 wherein:

a) a first portion from said at least three different portions includes every first window of three windows of said block;

b) a second portion from said at least three different portions includes every second window of three windows of said block;

c) a third portion from said at least three different portions includes every third of three windows of said block.

* * * * *